United States Patent [19]
Doyle et al.

[11] Patent Number: 5,858,843
[45] Date of Patent: Jan. 12, 1999

[54] LOW TEMPERATURE METHOD OF FORMING GATE ELECTRODE AND GATE DIELECTRIC

[75] Inventors: Brian S. Doyle, Cupertino; David B. Fraser, Danville, both of Calif.

[73] Assignee: Intel Corporation, Santa Clara, Calif.

[21] Appl. No.: 722,606

[22] Filed: Sep. 27, 1996

[51] Int. Cl.$^6$ .................................................. H01L 21/336
[52] U.S. Cl. ........................ 438/299; 438/183; 438/180
[58] Field of Search .................................. 438/183, 180, 438/181, 297, 299

[56] References Cited

U.S. PATENT DOCUMENTS

| | | | |
|---|---|---|---|
| 4,711,701 | 12/1987 | McLevige | 438/183 |
| 4,728,621 | 3/1988 | Graf et al. | 438/183 |
| 4,732,871 | 3/1988 | Buchmann et al. | 438/182 |
| 4,753,897 | 6/1988 | Lund et al. | 438/296 |
| 4,808,545 | 2/1989 | Balasubramanyam et al. | 438/183 |
| 4,843,024 | 6/1989 | Ito | 438/178 |
| 4,863,879 | 9/1989 | Kwok | 438/183 |
| 4,871,419 | 10/1989 | Nakano | 438/181 |
| 5,212,118 | 5/1993 | Saxena | 118/723 E |
| 5,350,492 | 9/1994 | Hall et al. | 438/694 |
| 5,422,289 | 6/1995 | Pierce | 438/297 |
| 5,472,508 | 12/1995 | Saxena et al. | 118/723 E |
| 5,569,624 | 10/1996 | Weiner et al. | 438/285 |
| 5,652,157 | 7/1997 | Hirano et al. | 438/183 |
| 5,666,305 | 9/1997 | Mihara et al. | 365/145 |
| 5,688,700 | 11/1997 | Kao et al. | 438/182 |

OTHER PUBLICATIONS

Wolf, S. "Silicon Processing for the VLSI Era vol. 2– Process Integration" Lattice Press. Sunset Beach CA, USA. pp. 635–638, 1986.

*Primary Examiner*—Charles Bowers
*Assistant Examiner*—Craig Thompson
*Attorney, Agent, or Firm*—Naomi Obinata

[57] ABSTRACT

A method of forming a field effect transistor structure for making semiconductor integrated circuits is disclosed. The method utilizes a novel processing sequence where the high temperature processing steps are carried out prior to the formation of the gate dielectric and gate electrode. The process sequence proceeds as follows: A mask patterned in replication of a to-be-formed gate is deposited onto a substrate. Then, a high temperature step of forming doped regions is performed. Then, a high temperature step of forming a silicide is performed. Next, a planarization material is deposited over the mask and is planarized. The mask is removed selectively to the planarization material to form an opening within the planarization material. The gate dielectric and gate electrode are formed within the opening.

22 Claims, 12 Drawing Sheets

LOW TEMPERATURE METHOD OF FORMING GATE ELECTRODE AND GATE DIELECTRIC

FIELD OF THE INVENTION

This invention relates to the field of semiconductor processing. More specifically, this invention relates to the structure and formation of a transistor device.

DESCRIPTION OF THE RELATED ART

The integrated circuit device is created by fabricating onto a substrate patterned layers of semiconductive, insulating and conductive materials forming circuit lines, holes and interconnects. Typical dimensions of the patterned layered materials are less than 1 micron in width. The field effect transistor ("FET") is the basic semiconductor transistor device structure that is used to form a number of different types of integrated circuit devices, including memory devices and microprocessors. The FET contains an insulated gate structure which overlies a channel region between a source and drain. The gate structure is comprised of a material having characteristics of electrical conductivity, such as doped polysilicon, separated a small distance from the underlying silicon substrate via a thin insulating layer usually made of silicon dioxide. The source and drain are formed in the silicon substrate by introducing dopants in controlled amounts to make the source and drain p-type or n-type relative to the surrounding silicon. The dopants for the source and drain are incorporated into the silicon using diffusion or ion implantation plus anneal, both of which processes require subjecting the substrate to high temperatures.

The typical process to form today's typical transistor structure relies on the gate stack to be formed early in the sequence to serve as an alignment mechanism for forming the source and drain regions. First, a silicon dioxide layer is thermally grown on a silicon substrate to form the gate dielectric. Then, the polysilicon gate is formed over the gate dielectric. Next, a first shallow source/drain portion is formed in alignment with the polysilicon gate. The process for formation of the first source/drain portion includes a high temperature process step on the order of 700 degrees C. or higher to activate ion-implanted dopants in the silicon and to remove damage to the silicon crystal. Spacers are then created and any gate oxide that is not directly underneath the polysilicon gate is removed. A second, deeper source/drain portion is formed on either side of the spacers. The process for formation of the second source/drain portion also includes a high temperature process step on the order of 700 degrees C. or higher to activate ion-implanted dopants in the silicon and to remove damage to the silicon crystal. Following formation of the second source/drain portion, silicide is formed on the second source/drain portion. Silicide formation also requires high temperature, on the order of 700 degrees C. or higher. Silicide is formed by depositing a silicide-forming metal over the surface of the substrate and heating the substrate to cause silicide to form where the deposited metal and silicon come into direct contact. Because of the several high temperature steps occurring after formation of the gate dielectric and gate, the materials for the gate oxide and gate electrode must be selected for capability of withstanding high temperature processing.

In response to continuing requirements for shrinkage of device dimensions, the gate becomes narrower and the gate dielectric becomes thinner. Modern device requirements include gate width of about 0.35 microns and gate dielectric of less than 50 angstroms thickness. Polysilicon as the gate material contains limitations to even further shrinkage. Because polysilicon is a semiconductive material as opposed to a conductive material, polysilicon contains a degree of electrical resistivity that limits free flow of current. This in turn poses speed limitations in the device. Alternative schemes to overcome the speed limitations in using polysilicon have been tried, such as using more conductive materials stacked onto the polysilicon. These alternative schemes are not considered practical because of the high costs for making what are actually only incremental and small improvements. With the current process sequence, however, there is no practical alternative to polysilicon as the gate material because the sequence calls for using the gate as a mask for forming the source and drain. It would be advantageous to have a process that would allow for the use of a material having better electrical conductivity than doped polysilicon.

To have increasing gate capacitance to accommodate shrinking features under the current process sequence, it is necessary to further thin the silicon dioxide gate dielectric. However, limitations in manufacturing capabilities render it less and less feasible to continue to thin the gate dielectric layer. Additionally, electrical problems are encountered in that an ever thinning gate dielectric increases the risk of charge tunneling arising from charge leakage. It would be advantageous to have a process that would allow for the use of a material having a higher dielectric constant than silicon dioxide so that the gate dielectric would not have to be so thin.

The currently used process also limits enabling new applications for the transistor structure. For example, it may be desirable to use the FET in the application of ferroelectric memory. But to do so a ferroelectric material would be needed for the gate dielectric. There is no known ferroelectric material that can withstand the high temperature processing requirements under the current fabrication process. It would be advantagious to be able to use the FET for new applications such as ferroelectric memory.

SUMMARY OF THE INVENTION

A method of forming an FET structure to enable greater flexibility in the selection of gate dielectric and gate materials is disclosed. The method incorporates steps and materials to carry out high temperature processing steps prior to formation of a self-aligned gate. A selectively removable mask dimensioned in accordance with a to-be-formed transistor gate is formed on a substrate. A doped region is formed within the substrate in alignment with the mask. Then, a planarization material is formed over the mask. The planarization material is planarized.

DETAILED DESCRIPTION OF THE INVENTION

The present invention is a novel method for fabrication of a transistor structure in an integrated circuit device. Because the method involves performing high temperature processing steps prior to formation of the gate, the method allows for a greater degree of choice of materials for the gate and gate dielectric. Under this invention, electrically advantageous materials for the gate and gate dielectric that do not necessarily hold up to high temperature processing can be used.

The Structure

Figure 1:
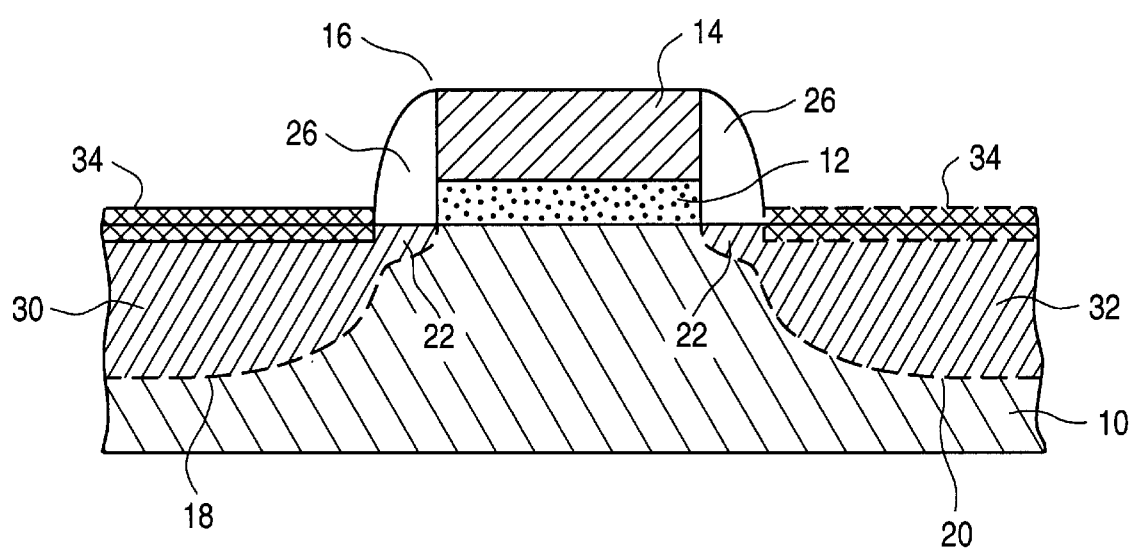
FIG. 1 is a side view illustration of a structure formed by the related art integrated circuit fabrication process.

FIG. 1 shows a typical transistor structure in today's integrated circuit devices. There is provided a substrate 10, usually silicon. Substrate 10 contains a thin layer of gate dielectric 12, usually made of silicon dioxide, having a dielectric constant of approximately 4. Gate dielectric 12 is usually about 50 angstroms thickness. A polysilicon gate 14 of a width of about 0.4 micrometers is directly on gate oxide 12. Polysilicon is the material of choice for gate 14 because it is electrically conductive when doped and can withstand high temperatures during subsequent processing. The stack having polysilicon gate 14 over gate dielectric 12 forms a gate structure 16. Gate structure 16 is in alignment with source and drain areas 18 and 20. Source and drain areas 18 and 20 include shallow junction portions 22. Spacers 26 are found adjacent to and on either side of gate structure 16. Spacers 26 are made of a dielectric material, usually silicon dioxide or silicon nitride. Deeper source and drain portions 32 are separated a distance from the edges of gate structure 16 edges to reduce hot electron effects and to control short channel effects that can occur from junction-junction electrical talking. A silicide 34 is found on deeper source and drain structures 32 separated from gate 14 by spacers 26. Silicide 34 is used to facilitate subsequent contacting of metallic interconnection lines for carrying current to the FET. Note that silicide 34 is not formed directly adjacent gate 14 because of potential undesirable silicide formation on the sidewalls of gate 14.

Figure 2:
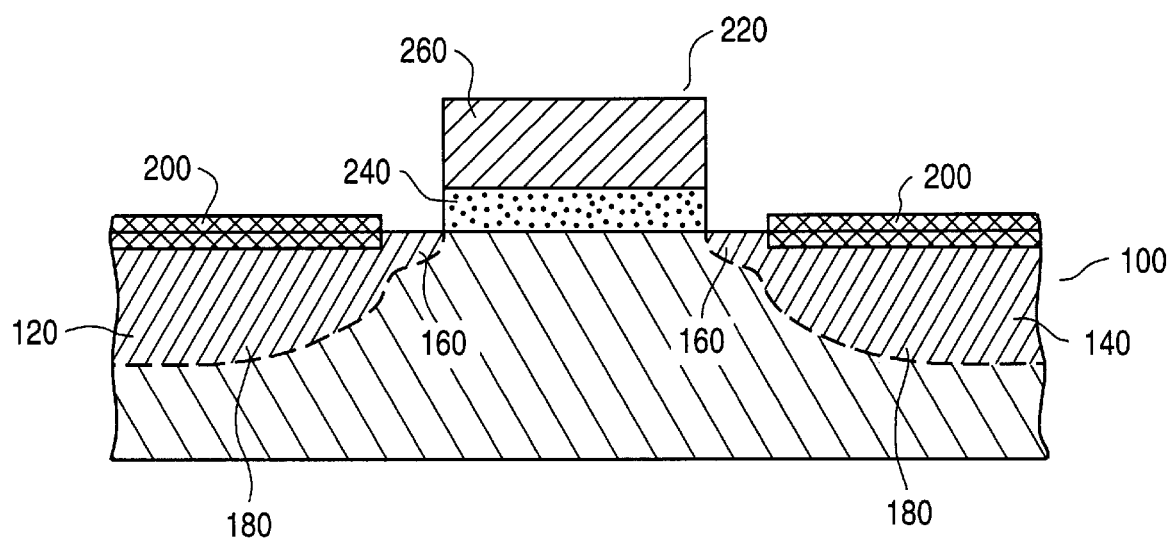
FIG. 2 is a side view illustration of an embodiment of the FET structure formed using the method of the invention.

Referring to FIG. 2, the preferred embodiment of the device fabricated using the method of the present invention is shown. Substrate 100, preferably a silicon wafer, contains doped regions forming a source 120 and a drain 140. Source 120 and drain 140 contain shallow regions 160 and deep regions 180. Silicide 200 for contact metallization is formed on deep regions 180. A stacked gate 220 having a gate dielectric 240 and gate 260 is located on the surface of the substrate in alignment with shallow regions 160 of source 120 and drain 140. Gate dielectric 240 is preferably a material having a higher dielectric constant than the dielectric constant of silicon dioxide. Examples of such materials are lead zirconate titanate, barium strontium titanate, aluminum oxide, tantalum pentoxide, bismuth strontium titanate, spin on glass, or organic polymer or other dielectric material having a higher dielectric constant than silicon dioxide. A ferroelectric material such as barium magnesium fluoride can also be used for the gate dielectric. A gate dielectric material which is of a lower melting point than the minimum high-temperature process temperature can be used. Gate material 260 is preferably a material having high electrical conductivity such as a metal. A gate material which is of a lower melting point than the minimum high-temperature process temperature can be used.

The Method

The process sequence of the invention generally comprises the steps of forming a high temperature masking material on a substrate patterned to essentially match the pattern of a to-be-formed gate structure. The patterned high temperature masking material serves as a mask to protect underlying silicon during execution of process steps involving high temperature processing, including formation of the source and drain and formation of silicide. Following completion of the high temperature steps, the high temperature mask is removed. A gate structure can then be formed within the opening remaining after mask removal. A more detailed process sequence is described below.

Figure 3A:
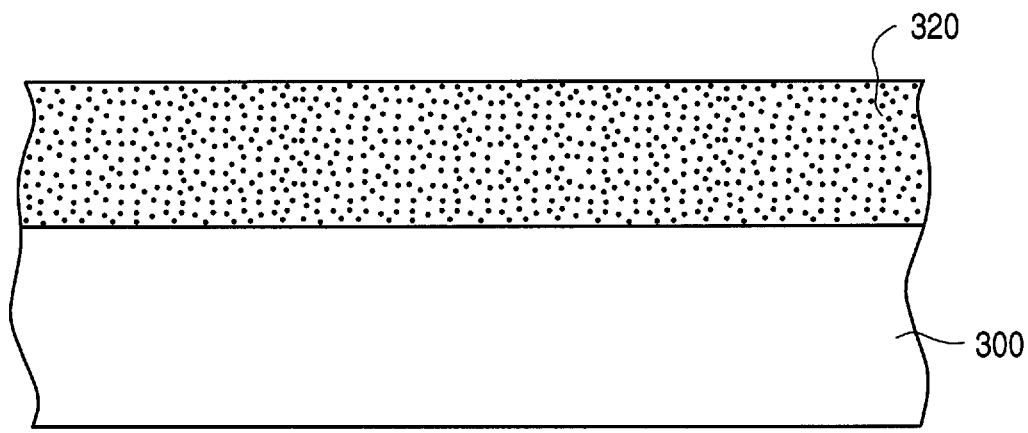
FIG. 3A–3Q is a side view illustration of steps of formation of an FET using a method of the present invention.

Turning to FIG. 3A, there is provided a substrate 300. Substrate 300 in this example is a silicon wafer. Silicon formed on other substrates such as silicon dioxide or aluminum oxide or glass, on which integrated circuit devices can be built, may also be used. A layer of a high temperature mask material 320 is deposited on substrate 300. Mask material 320 can be made of any material that can withstand high temperature processing on the order of 700 to 1100 degrees C. without losing structural integrity, and that can be selectively chemically etched. The preferred mask material 320 is silicon dioxide. The thickness of mask material 320 is chosen to be the approximate targeted height for the to-be-formed gate and gate dielectric stack. By way of example, if the gate thickness will be 1200 Angstroms, and the gate dielectric will be 800 Angstroms, then the thickness of the mask material should be targeted to be 2000 Angstroms thick. It is understood that mask material 320 thickness may vary widely depending on the thicknesses chosen for the materials to be used for the gate electrode and gate dielectric for a specified transistor structure.

Figure 3B:
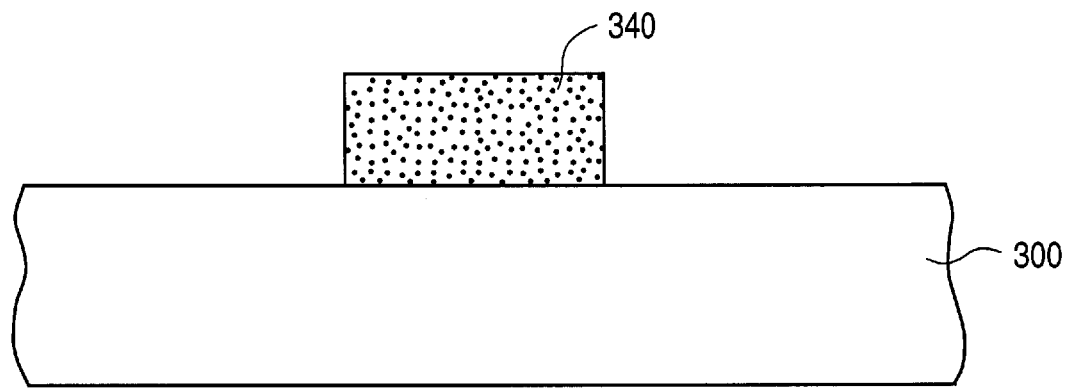

FIG. 3B illustrates a mask 340 created from mask material 320. The dimensions of mask 340 are those of a to-be-formed gate structure. Preferably, mask 340 is formed by a known photoresist lithography and plasma etching process. Photoresist is deposited on top of mask material 320 to form a coating. A pattern is developed in the photoresist using a photolithography mask having a predetermined gate pattern. The gate pattern developed in the photoresist is transferred into mask material 320 using plasma etching, to form mask 340. Mask 340 is used to shield the underlying silicon in substrate 300 during subsequent process steps.

Figure 3C:
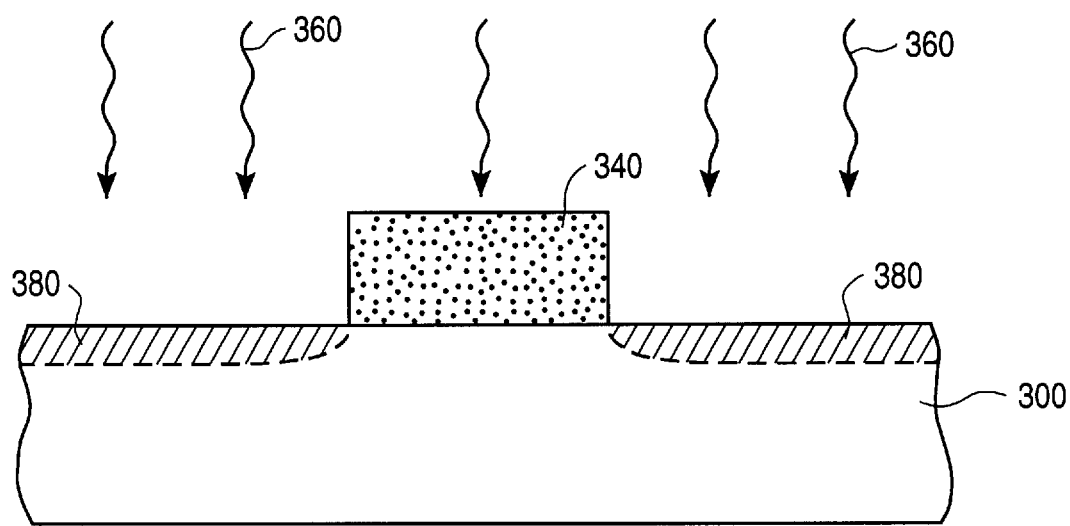

FIG. 3C illustrates a formed shallow junction 380. Preferably, ion implantation is used but other methods such as diffusion can be used. Substrate 300 including mask 340 is exposed to a stream of preselected dopant ions 360, which is preferably boron for making p-type material, and preferably arsenic for making n-type material. The energy and other process conditions for the ion implantation are chosen to create a preselected depth and shape of shallow junction 380. The preselected depth and shape is determined using known methods based on the design rules for the transistor being created. Following the first ion implantation to form shallow junction 380, substrate 300 is exposed to a high temperature anneal (not shown), from usually around 700 degrees C. to 1100 degrees C. using a known process in the art, for the amount of time needed to activate the freshly implanted dopant species. The anneal also getters damage from the crystalline lattice structure caused by the ion implantation.

Figure 3D:
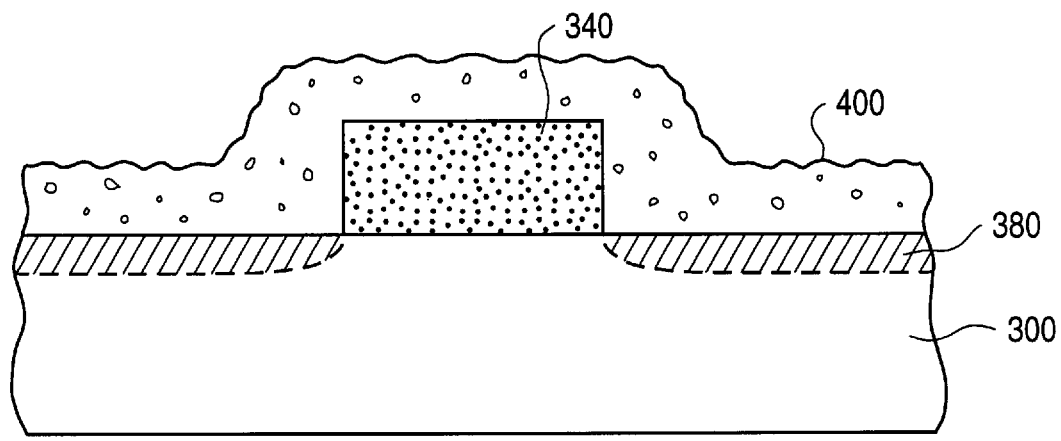

FIG. 3D illustrates the creation of the source and drain. A layer of insulating spacer material 400 is formed over the surface of substrate 300, including over mask 340. Spacer material 400 is an etchable material that is different from mask material 320 but can also withstand high temperature processing (on the order of 700 to 1100 degrees C.). Silicon nitride is the preferred material for spacer material 400. Spacer material 400 is typically formed by blanket deposition (that is, uniformly covering all surfaces) preferably using chemical vapor deposition. Spacer material 400 is deposited conformally so that it follows the shape of the underlying topography including mask material 340 and silicon surfaces of substrate 300. Then, spacer material 400 is etched anisotropically, i.e., in a uniformly downward direction, using gas plasma. Etching is complete when spacer material 400 is completely removed from the horizontal silicon surfaces of substrate 300 and a portion of material adjacent each vertical edge of the mask remains.

Figure 3E:
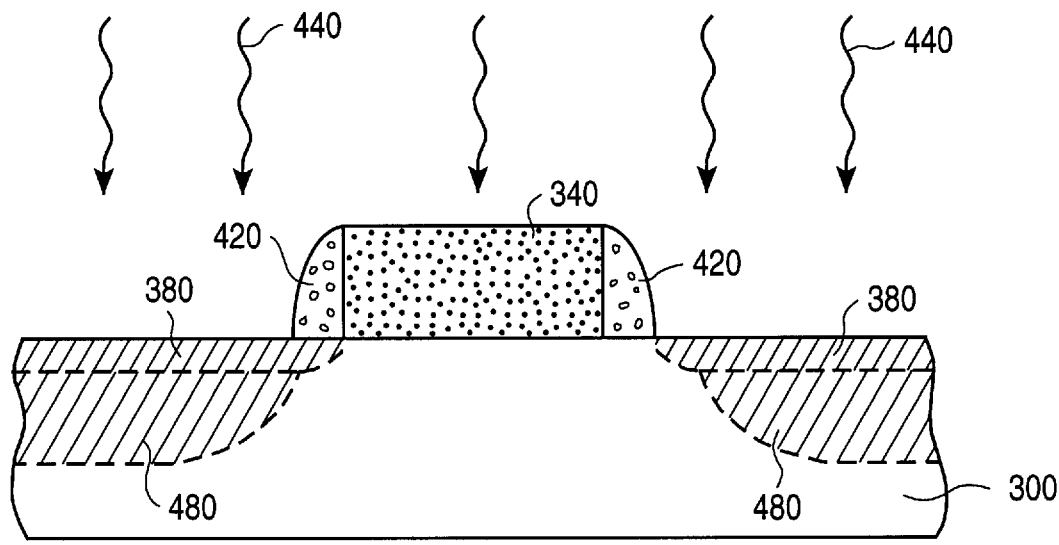

FIG. 3E illustrates the formed spacers 420 which, together with mask 340, serve as a mask for a second doping procedure. The preferred method for the second doping procedure is ion implantation, although other methods such as diffusion can be used. Substrate 300 containing mask 340 and spacers 420 is exposed to a stream of preselected dopant ions 440. The dopants will preferably (but not necessarily) be the same as those used for creating shallow junction 380. The ions are implanted using a known process where the energy of ions is chosen to create a desired shape of deeper source and drain regions 480 in alignment with spacers 420 spreading from the surface of substrate 300 to a preselected depth greater than shallow junction region 380. The preselected depth and shape for deeper source drain regions 480 is determined using known methods based on the design rules for the transistor being created. Following this second ion implantation, substrate 300 is exposed to a high temperature anneal (not shown) usually around 700 degrees C. to 1100 degrees C., at preselected process conditions known in the art to drive the freshly implanted dopant species into the silicon to a preselected depth greater than shallow junction 380. The anneal also getters damage from the lattice structure caused by the ion implantation. It should be noted that most integrated circuits require the presence of both n-type and p-type FET structures. Each structure must be formed separately using a mask covering portions to be protected from dopants while the uncovered portions are being doped. It is understood that a person of ordinary skill in the art will be able to repeat the steps described as needed to create the various types of FET structures desired for a given integrated circuit.

Figure 3F:
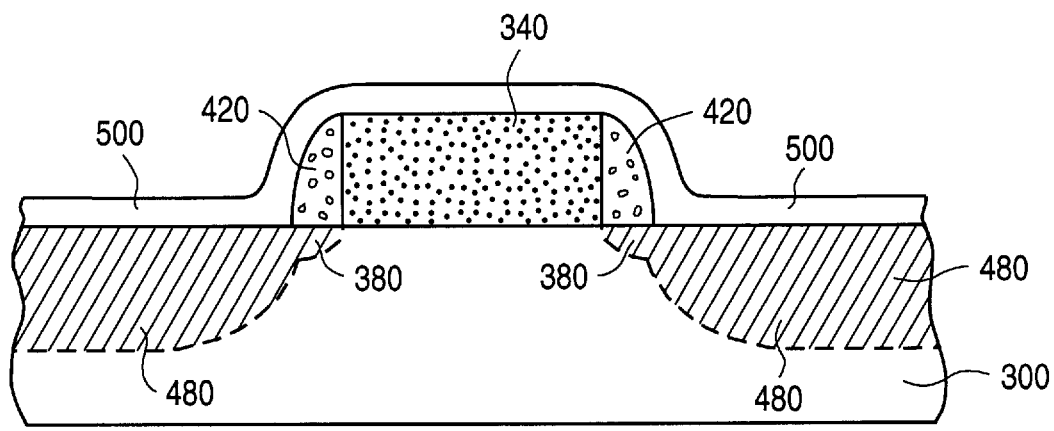

FIG. 3F illustrates a layer of silicide-forming metal 500, usually titanium or cobalt, preferably titanium, covering the surface of substrate 300. Metal 500 is deposited preferably using chemical vapor deposition to cover substantially the whole surface including mask 340, spacers 420, and deeper source and drain regions 480. Substrate 300 is then subjected to a preselected high temperature anneal (not shown) in a known process compatible with the formation of silicide for the particular metal being used (usually 700 degrees C. and above). This heating causes silicide to form in areas where metal and silicon are directly in contact. Silicide does not form where metal is over non-silicon areas, such as mask 340 and spacers 420. Substrate 300 is heated for the known duration necessary to form a preselected thickness of silicide as determined by the design rules for the given transistor structure. Following heating to form silicide, any remaining metal layer 500 is removed by a known method such as selective wet etching.

Figure 3G:
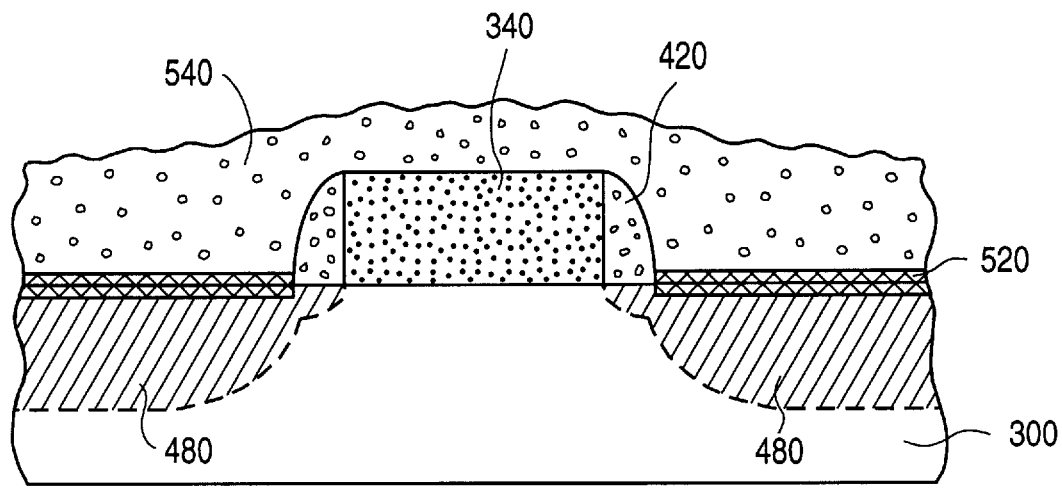

FIG. 3G illustrates the formed silicide 520 and the commencement of the following process step. Upon formation of silicide 520, the high temperature processing steps are now complete. A layer of planarization material 540 is deposited over the entire surface of substrate 300. Planarization material 540 is preferably the same material as spacers 420. The thickness of planarization material 540 over deeper source and drain regions 480 should be at least approximately the height of mask 340.

Figure 3H:
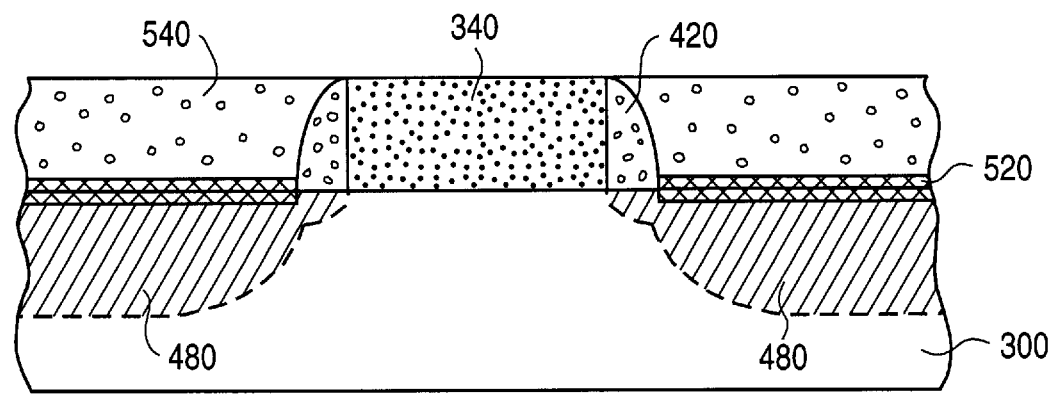

FIG. 3H illustrates a planarized surface following planarization. Planarization is done preferably using chemical mechanical polishing. Planarization material 540 is planarized until the surface of mask 340 is exposed. The result of planarization is a smooth substantially flat surface with the top surface of mask 340 exposed.

Figure 3I:
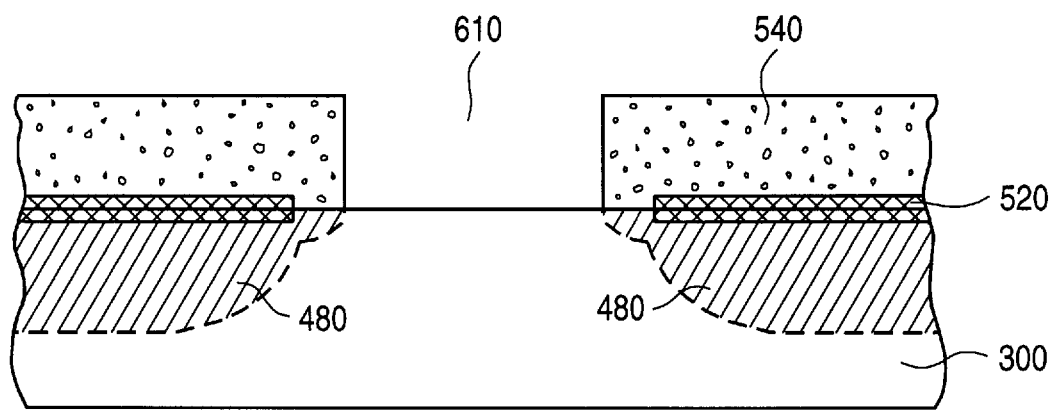

FIG. 3I illustrates the next step which is removal of mask 340 to create opening 610. Preferably mask 340 is removed by wet chemical etching. The etching process is chosen to be one that removes the mask cleanly, so that what remains is a clean silicon surface which had been underneath mask 340. Note that mask 340 is removed selectively relative to surrounding spacers 420 and planarization material 540.

Figure 3J:
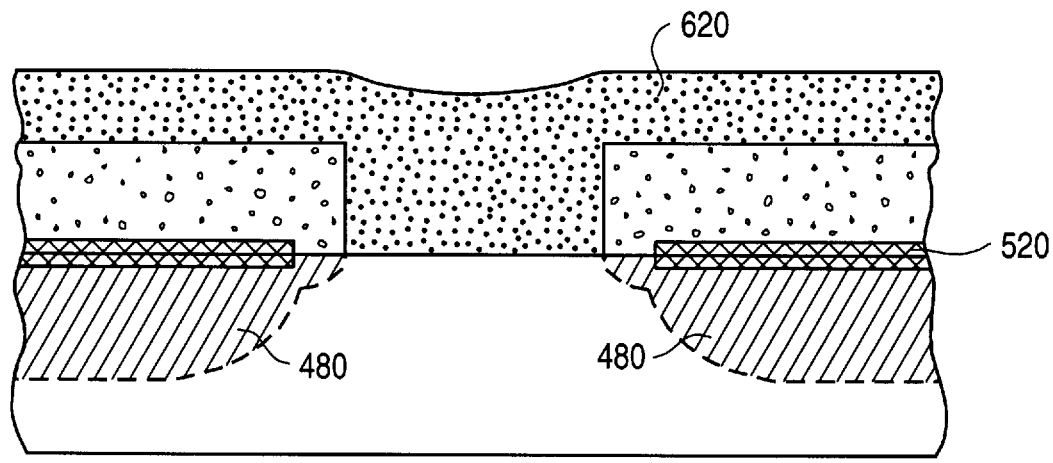

FIG. 3J illustrates a gate dielectric 620 formed into opening 610. Gate dielectric 620 is a preselected material preferably having a dielectric constant greater than that of silicon dioxide. Examples of this material are barium strontium titanate, lead zirconate titanate, aluminum oxide, tantalum pentoxide, bismuth strontium titanate, spin on glass, or organic polymer. A ferroelectric material such as barium magnesium fluoride can be used as the gate dielectric for creating a ferroelectric memory device. These materials are considered electrically advantageous because of their higher dielectric constant, making it possible to achieve a desired gate capacitance with greater thickness in the transistor. This invention enables the use of these electrically advantageous materials because the high temperature process sequence is already completed before these materials are used. Gate dielectric 620 is deposited into opening 610 completely without creating voids in the deposited film, using a known process such as chemical vapor deposition. In one embodiment of the invention the deposited gate dielectric material 620 should fill opening 610 completely as well as cover the top surface of planarization material 540.

Figure 3K:
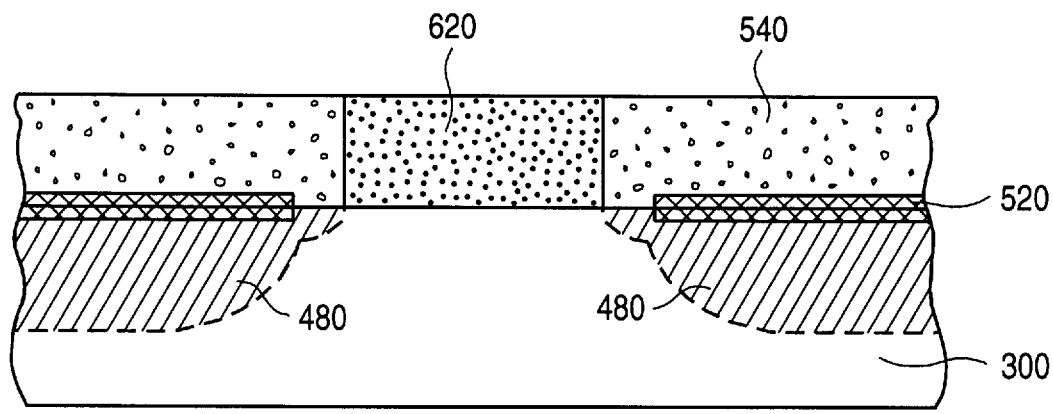

FIG. 3K illustrates the next step which is to planarize gate dielectric to create a smooth flat top surface exposing gate dielectric 620. Planarization is done preferably using chemical mechanical polishing.

Figure 3L:
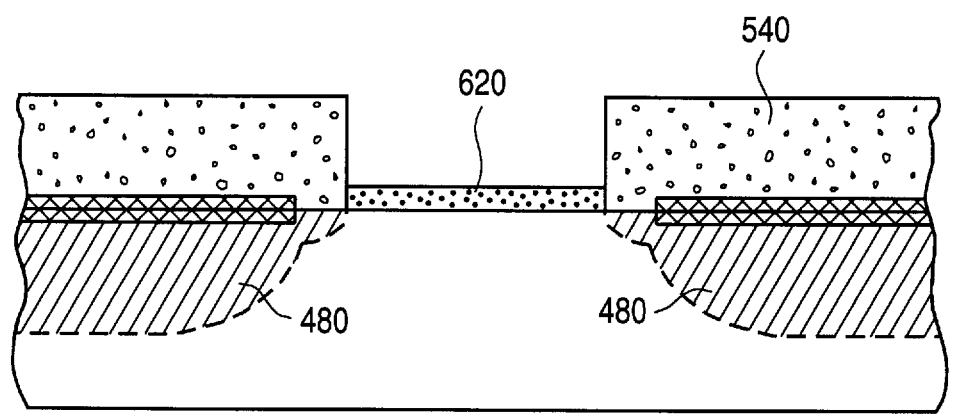

FIG. 3L illustrates the gate dielectric 620 in completed form. Planarized gate dielectric 620 is plasma etched to a preselected thickness within opening 610 using a known process that will etch gate dielectric 620 uniformly as well as selectively relative to surrounding planarization material 540. The thickness of the gate dielectric is preselected to be that required for the degree of capacitance desired for the requirements of the transistor and the dielectric properties of the material being used. An example of a preferred thickness is greater than 100 angstroms thickness.

Figure 3M:
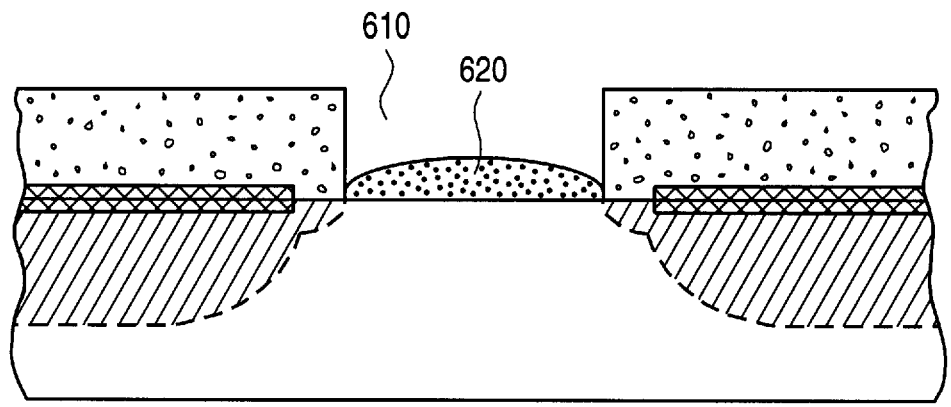

FIG. 3M illustrates an alternative method of forming the gate dielectric. Instead of deposition followed by planarization, gate dielectric material 620 is selectively deposited into opening 610 by a known selective chemical vapor deposition process to be in accordance with the target thickness of gate dielectric required for the transistor.

Figure 3N:
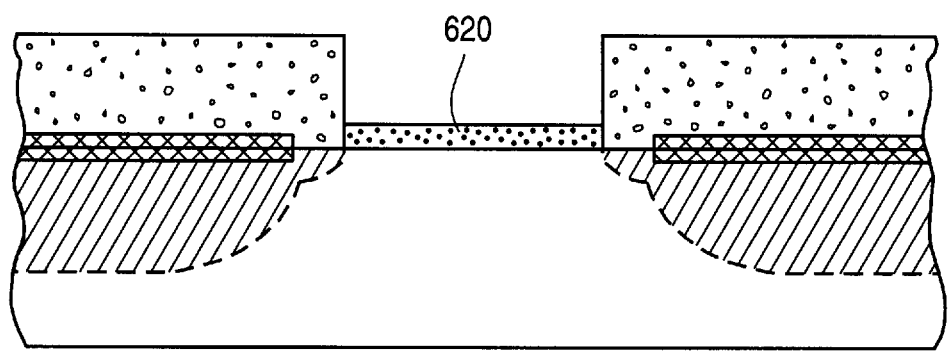

FIG. 3N illustrates the completion of formation of gate dielectric 620 using the alternative method. Following selective deposition, substrate 300 is heated to an elevated temperature near the melting point of gate dielectric 620. This heating step, known as reflow, causes gate dielectric 620 to flow within opening 610 to achieve the desired flat surface to form gate dielectric 620 at its preselected thickness.

Figure 3O:
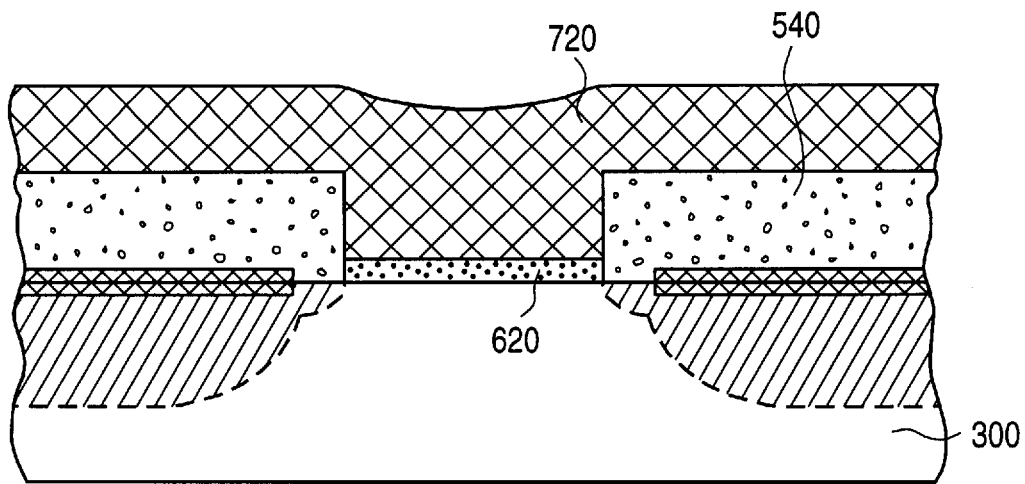

FIG. 3O illustrates a gate electrode material 720 formed in opening 610. Gate electrode material 720 is selected to be one that has desirable electrical conductivity characteristics and, differing from the related art, can be a metal such as aluminum, aluminum alloy, titanium, titanium alloy or titanium nitride or other metallic material or compound. Note that the invention lends itself to more flexibility in the choice of gate electrode material because the high temperature process sequence is already completed by the time the gate electrode is formed. Preferably, gate electrode material 720 is deposited directly on gate dielectric 620 using known chemical vapor deposition or physical vapor deposition processes. Gate electrode material 720 should completely fill opening 610 and cover the top surface of planarization material 540.

Figure 3P:
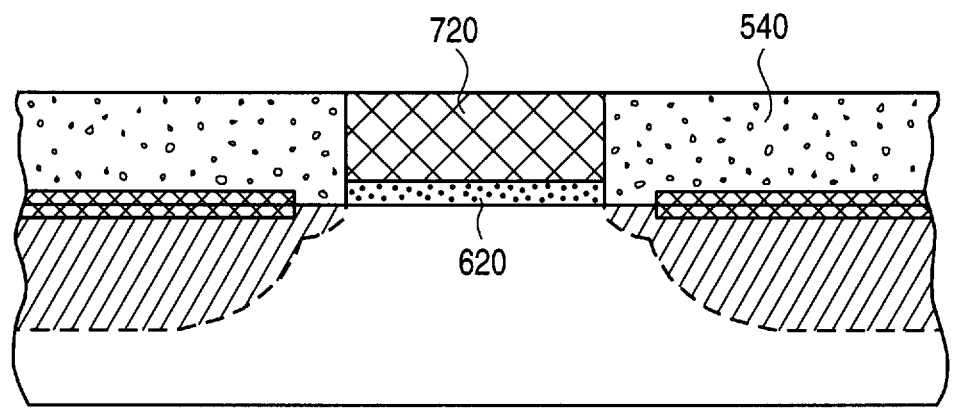

FIG. 3P illustrates a planarized gate electrode material 720. Planarization is done preferably using chemical mechanical polish so that the top surface of gate material 720 is planar with the surface of planarization material 540 so that there is a gate electrode material 720 portion and planarization material 540 portion. Alternatively, gate electrode material 720 can be selectively deposited into opening 610 and reflowed in a manner similar to that described above for forming gate dielectric 620.

Figure 3Q:
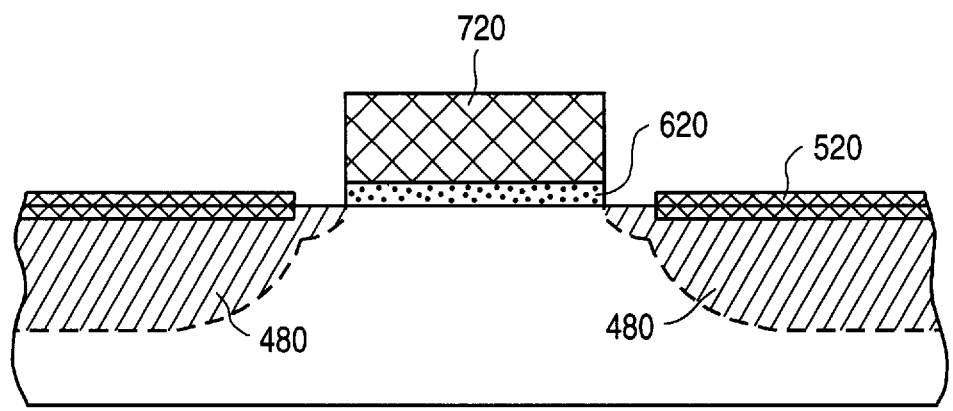

FIG. 3Q illustrates the end result of the preferred inventive process sequence. Following formation of gate electrode 720, planarization material portion 600 and spacers 420 are removed. Preferably, removal of planarization material portion 600 and spacers 420 is done using selective chemical etching. Note that, alternatively, planarization material portion 600 and/or spacers 420 can remain for use as insulation for gate electrode 720.

It should be noted that, depending on the integrated circuit device design requirements, the materials or combinations of materials actually used for forming the gate may differ from those described herein. Moreover, the method of creating the shape of the source and drain may differ from that disclosed herein. In some devices the use of a silicide may not be required. Or still other integrated circuit device designs may call for the silicide to be extended to be in contact or near contact with the edge of the gate dielectric or gate. If the silicide is to be extended, then it is obvious to those skilled in the art that the spacers must be removed prior to deposition of the silicide-forming material. All of these and other combinations are possible in this invention of a novel method for forming a gate aligned with the source and drain, for which the sequence of steps are such that the high temperature processing steps occur prior to formation of the gate dielectric and gate.

We claim:

1. A method of forming an integrated circuit device transistor structure on a substrate, comprising the steps of:

forming a selectively removable mask in accordance with the dimensions of a to-be-formed transistor gate;

forming a first doped region within the substrate in alignment with said mask;

depositing a spacer material over said mask;

forming spacer structures from the spacer material in alignment with said mask;

forming a second doped region within the substrate using said spacer structures as a doping mask;

forming a planarization material over said mask; and planarizing the planarization material.

2. A method of forming an integrated circuit device structure as in claim 1, further comprising the step of selectively removing said mask relative to the planarization material and the spacer material to form an opening.

3. A method of forming an integrated circuit device structure as in claim 2, further comprising the step of forming a transistor gate stack within said opening.

4. A method of forming an integrated circuit device transistor structure, comprising the steps of:

providing a substrate;

forming a mask material on said substrate;

patterning said mask material to form a mask having substantially vertical and continuous sidewalls;

forming a doped region within said substrate in alignment with said mask;

forming a planarization material over said mask;

planarizing said planarization material such that the top surface of said planarization material is at substantially the same level as the top surface of said mask;

selectively removing said mask so as to create an opening in said planarization material;

forming within said opening a gate dielectric; and forming a gate electrode on said gate dielectric.

5. A method of forming an integrated circuit device transistor structure as in claim 4, wherein said step of forming said gate dielectric further comprises:

depositing said gate dielectric within said opening using selective chemical vapor deposition.

6. A method of forming an integrated circuit device transistor structure as in claim 4, wherein said step of forming said gate dielectric further comprises:

forming a layer of gate dielectric over the entire surface of said structure including within said opening;

planarizing said layer of gate dielectric; and etching said gate dielectric within said opening to a preselected thickness of said gate dielectric.

7. A method of forming an integrated circuit device transistor structure as in claim 4, wherein said step of forming a gate electrode further comprises:

depositing said gate electrode directly on said gate dielectric using selective chemical vapor deposition.

8. A method of forming an integrated circuit device transistor structure as in claim 4, wherein said step of forming a gate electrode further comprises:

forming a layer of gate electrode over the entire surface of said structure including within said opening and directly on said gate dielectric; and planarizing said gate electrode layer.

9. A method of forming an integrated circuit device transistor structure as in claim 4, wherein said gate dielectric is a ferroelectric material.

10. A method of forming an integrated circuit device transistor structure as in claim 4, wherein said gate dielectric is a material selected from the group comprising silicon dioxide, silicon nitride, barium strontium titanate, lead zirconate titanate, aluminum oxide, tantalum pentoxide, bismuth strontium titanate, spin on glass, organic polymer, and barium magnesium fluoride.

11. A method of forming an integrated circuit device transistor structure as in claim 4, where in said gate electrode is a metallic material.

12. A method of forming an integrated circuit device transistor structure as in claim 11, where in said gate electrode is a material selected from the group comprising aluminum, aluminum alloy, titanium, titanium alloy and titanium nitride.

13. A method of forming an integrated circuit device transistor structure as in claim 4, further comprising the steps of:

depositing a metallic material onto said structure; and forming a silicide where said metallic material and silicon come into direct contact.

14. A method of forming an integrated circuit device transistor structure, comprising the steps of:

providing a substrate;

forming a mask material on said substrate;

patterning said mask material to form a mask;

forming a first doped region within said substrate in alignment with said mask;

forming a spacer adjacent said mask of a material that is different from the mask material, said spacer being formed after patterning said mask material;

forming a second doped region within said substrate adjacent to said spacer;

forming a planarization material over said mask and spacer;

planarizing said planarization material so that the top surface of said planarization material is substantially level with the top surface of said mask;

selectively removing said mask so as to create a clean opening in said spacer and planarization material, said opening having a substantially similar shape as said mask;

forming within said opening a gate dielectric; and forming a gate electrode on said gate dielectric.

15. A method of forming an integrated circuit device transistor structure as in claim 14, wherein said spacer and said planarization material comprise the same material.

16. A method of forming an integrated circuit device transistor structure as in claim 15, wherein said spacer and said planarization material comprise silicon nitride.

17. A method of forming an integrated circuit device transistor structure as in claim 14, wherein said spacer is comprised of silicon nitride.

18. A method of forming an integrated circuit device transistor structure as in claim 14, further comprising the steps of:

depositing a metallic material onto said structure; and forming a silicide where the metallic material and the silicon come into direct contact.

19. A method of forming an integrated circuit device transistor structure on a substrate, comprising the steps of:

forming a mask in accordance with the dimensions of a to-be-formed gate stack;

forming a first doped region in the substrate in alignment with the mask;

depositing a spacer material over the mask;

forming a spacer structure adjacent the mask by etching said spacer material;

forming a second doped region in alignment with the spacer structure;

removing the mask after formation of the doped regions so as to create an opening; and forming a gate stack within the opening.

20. A method of forming an integrated circuit device transistor on a substrate, comprising the steps of:

forming a mask directly on the substrate, said mask having substantially vertical and continuous sidewalls;

forming a doped region in the substrate in alignment with the mask;

forming a silicide on preslected portions of said substrate; and forming a planarization layer after formation of said silicide.

21. A method of forming an integrated circuit device transistor structure on a substrate as in claim 20, further comprising the step of:

removing said mask after formation of said planarization layer so as to create an opening in said planarization layer.

22. A method of forming an integrated circuit device transistor structure on a substrate as in claim 21, further comprising the step of:

forming a gate stack within said opening.

* * * * *

UNITED STATES PATENT AND TRADEMARK OFFICE
CERTIFICATE OF CORRECTION

PATENT NO.    : 5,858,843
DATED         : January 12, 1999
INVENTOR(S)   : Doyle et al.

It is certified that error appears in the above-identified patent and that said Letters Patent is hereby corrected as shown below:

<u>Column 8,</u>
Line 27, delete "to a preselected thickness of said gate dielectric".

Signed and Sealed this

Seventh Day of October, 2003

JAMES E. ROGAN
*Director of the United States Patent and Trademark Office*